United States Patent

Boudot et al.

[11] 4,350,559
[45] Sep. 21, 1982

[54] PROCESS FOR THE MANUFACTURE OF POLYCRYSTALLINE GARNET AND CORRESPONDING MONOCRYSTAL

[75] Inventors: Bernard Boudot, Paris; Georges Nury, Frepillon, both of France

[73] Assignee: Rhone-Poulenc Industries, Paris, France

[21] Appl. No.: 204,896

[22] Filed: Nov. 7, 1980

[30] Foreign Application Priority Data

Nov. 9, 1979 [FR] France .................. 79 27657

[51] Int. Cl.$^3$ .................................. C30B 15/00
[52] U.S. Cl. .................. 156/617 SP; 156/DIG. 63; 23/305 RE; 252/62.57
[58] Field of Search .................. 156/617 SP, DIG. 63; 23/305 RE; 423/263, 593, 600; 256/62.57; 106/42; 75/134 T, 152

[56] References Cited

U.S. PATENT DOCUMENTS

| | | | |
|---|---|---|---|
| 3,386,919 | 6/1968 | Forrat | 156/615 |
| 3,562,175 | 2/1971 | Hickok | 423/263 |
| 3,563,897 | 2/1971 | West | 252/62.57 |
| 3,591,516 | 7/1971 | Rabatin | 23/305 RE |
| 3,681,010 | 8/1972 | Messier et al. | 423/263 |
| 3,681,011 | 8/1972 | Gazza | 23/24 R |
| 3,723,599 | 3/1973 | Brandle, Jr. et al. | 156/DIG. 63 |
| 3,736,106 | 5/1973 | Hamelin et al. | 252/62.57 |
| 3,751,366 | 8/1973 | Bomar, Jr. et al. | 252/62.57 |
| 3,838,053 | 9/1974 | Kestigian | 252/62.57 |
| 3,956,440 | 5/1976 | Deschamps et al. | 252/62.57 |
| 4,115,134 | 9/1978 | Rhodes | 423/263 |

OTHER PUBLICATIONS

Chemical Abstracts, vol. 70, 1969, p. 414, entry 92802j.
Chemical Abstracts, vol. 83, 1975, p. 192, entry 82187s.

*Primary Examiner*—Gregory N. Clements

[57] ABSTRACT

A process for the manufacture of a polycrystalline garnet and to the corresponding monocrystal.

The process comprises the following steps:
(1) a solution containing the salts of the constituent cations of the garnet, in the proportions corresponding to the composition of the latter, is prepared;
(2) corresponding hydroxides are co-precipitated by means of a base in order to obtain a co-hydroxide;
(3) if appropriate, the co-hydroxide is left to age;
(4) it is filtered off;
(5) it is washed;
(6) it is dried; and
(7) it is then calcined at a temperature above the temperature for the formation of the desired garnet structure.

The monocrystals obtained by Czochralski drawing of the polycrystalline garnets of the invention can be used, in particular, as substrates in magnetic bubble memory devices.

17 Claims, 4 Drawing Figures

PROCESS FOR THE MANUFACTURE OF POLYCRYSTALLINE GARNET AND CORRESPONDING MONOCRYSTAL

BACKGROUND OF THE INVENTION

The present invention relates to a process for the manufacture of polycrystalline garnet and to the corresponding monocrystal.

The use of monocrystals having a garnet structure, in particular as substrates for the manufacture of magnetic bubble memory devices, is well known. For this use, the monocrystals of garnet are essentially manufactured by Czochralski drawing of the polycrystalline mixed oxides having the garnet structure, which are hereafter referred to as polycrystalline garnets.

At the present time, polycrystalline garnets are prepared in accordance with three processes.

The first of these processes, described, for example, in *Journal of Crystal Growth*, 12, pp. 3–8 (1972), consists in following a procedure in which the various oxides forming part of the composition of the garnet are mixed in accordance with the following steps:
  the various oxides forming part of the composition of the garnet are calcined separately;
  the amounts fixed by the formula of the garnet for the various oxides are weighed;
  the oxides are mixed mechanically and the mixture obtained is compacted by compression;
  the compacted mixture is introduced into the drawing crucible; and
  the mixture is melted.

This process exhibits essentially two disadvantages. On the one hand, during the heating of the mixture, it is impossible to characterize the garnet structure of the polycrystalline mixture, the appearance of which depends on the temperature increase program used; on the other hand, because of the evaporation of certain subspecies, the composition of the bath at the moment of drawing, as a function of its composition at ambient temperature, can only be known from empirical relationships.

The second of these processes (described, for example, in German Pat. No. 2,615,554) consists in following a procedure in which the various oxides forming part of the composition of the garnet are mixed and then calcined so as to obtain the garnet structure prior to the melting operation. The calcination conditions (temperature and time) are determined as a function of the kinetics of solid-solid reactions, which themselves depend essentially on the physical properties of the oxides used and on the proportions of impurities therein.

This second prior art process is the most commonly used process for the preparation of polycrystalline garnets. Compared with the first prior art process, it permits a better knowledge of the composition of the bath at the moment of drawing, because of the possibility of characterizing the garnet structure. However, this process exhibits the disadvantage that it generally requires lengthy calcinations which, as has been demonstrated, do not always result in complete reactions between the oxides. For example, in the case of a $Gd_3Ga_5O_{12}$ garnet, calcination of a mixture of 3 mols of $Gd_2O_3$ to 5 mols of $Ga_2O_3$ for 100 hours at 1350° C. results in a mixture in which 10 percent by weight of the $Ga_2O_3$ has not reacted.

The third of these processes, described, for example, in *Journal of Crystal Growth*, 19, pp. 204–208 (1979), consists in thermally decomposing a dissolved mixture of the salts (carbonates, nitrates, chlorides, ammonium salts, sulphates, and the like) of the various elements constituting the garnet, and then subjecting the mixture to a heat treatment until the garnet structure is obtained.

The main disadvantage of this third prior art process is that it leads to impure garnets which are contaminated with the impurities resulting from incomplete decomposition reactions (for example, the presence of rare earth oxychlorides).

Applicants have invented a novel process for the manufacture of polycrystalline garnets of the foregoing types, which make it possible to draw a perfect monocrystal. This process overcomes the disadvantages of the prior art processes and provides numerous advantages. This is an important object of the present invention.

It is also an object of the present invention to provide novel processes for the production of polycrystalline garnets and the corresponding monocrystals.

It is a further object of the present invention to provide novel polycrystalline garnets and their corresponding monocrystals.

Other objects will be apparent to those skilled in the art from the present description, taken in conjunction with the appended drawings.

A related process is disclosed in Applicants' copending U.S. Application Ser. No. 204,894, filed Nov. 7, 1980.

GENERAL DESCRIPTION OF THE INVENTION

Figure 1:
FIG. 1 is a photomicrograph, magnified about 900 times, of a prior art polycrystalline garnet of Comparison Example 2, below.

The present invention comprises a process for the manufacture of a polycrystalline garnet, which process comprises:
  (1) preparing a solution containing the salts of the constituent cations of the garnet, in the proportions corresponding to the composition of the latter;
  (2) the corresponding hydroxides are co-precipitated by means of addition of a base in order to obtain a co-hydroxide;
  (3) preferably, the co-hydroxide is permitted to age;
  (4) it is filtered off;
  (5) it is washed;
  (6) it is dried; and
  (7) it is then calcined at a temperature above the temperature for the formation of the desired garnet structure.

The process of the present invention exhibits numerous advantages compared with the processes of the prior art; in particular, it makes it possible:
  (1) to obtain the garnet structure by calcination at a lower temperature and for a shorter time than in the processes of the prior art;
  (2) to obtain the garnet structure outside the enclosure for drawing the monocrystal, which ensures exact knowledge of the composition of the starting polycrystalline garnet by virtue of the possibility of characterizing the latter (for example, by measuring the crystal parameter); and (3) to achieve an absolutely complete reaction for the formation of the garnet structure; the polycrystalline garnet obtained is pure and, in particular, it does not contain unreacted oxides.

Thus, during the heating of the polycrystalline garnet in the drawing crucible, the evaporation of the subspecies of certain oxides is much less extensive than in the processes of the prior art. This results in the following additional advantages during the drawing of the monocrystalline garnet:

(1) Exact knowledge of the composition of the molten bath at the moment of drawing obviates the need to use empirical relationships aimed at correcting the various evaporations;

(2) Limitation of the formation of subspecies of certain oxides makes it possible to restrict the reactions of these subspecies with the drawing crucible, and this makes it possible to limit, on the one hand, the attack and the rapid destruction of the crucible, and, on the other hand, inclusions, in the drawn monocrystal, of the metal of which the crucible is made. These last advantages prove to be of considerable practical importance, especially in the particular case of drawing monocrystals of $Gd_3Ga_5O_{12}$ from an iridium crucible.

The garnets of the invention can be represented by the general formula:

$${C_3}[A_3](D_3)O_{12}$$

in which C, A and D represent one or more cations situated, respectively, in the dodecahedral, octahedral, and tetrahedral sites of the crystallographic structure.

The various cations which have been observed experimentally as being able to occupy one or two of these three types of sites are indicated in the table below (from S. Geller, *Zeitschrift für Kristallographie*, 125, pp. 1–47 (1967).

TABLE

| | |
|---|---|
| 1 | $Na^+$, $Cu^{2+}$, $Mg^{2+}$, $Ca^{2+}$, $Si^{2+}$, $Ba^{2+}$, $Zn^{2+}$, $Cd^{2+}$, $Y^{3+}$, $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$, $Zr^{4+}$, $Hf^{4+}$, $Bi^{3+}$, $Mn^{2+}$, $Fe^{2+}$, $Co^{2+}$ |
| 2 | $Li^+$, $Cu^{2+}$, $Mg^{2+}$, $Zn^{2+}$, $Sc^{3+}$, $Y^{3+}$, $Lu^{3+}$, $Yb^{3+}$, $Tm^{3+}$, $Er^{3+}$, $Ho^{3+}$, $Dy^{3+}$, $Al^{3+}$, $Ga^{3+}$, $In^{3+}$, $Ti^{4+}$, $Zr^{4+}$, $Hf^{4+}$, $Ge^{4+}$, $Sn^{4+}$, $V^{3+}$, $Nb^{5+}$, $Ta^{5+}$, $Sb^{5+}$, $Mn^{2+}$, $Mn^{3+}$, $Fe^{2+}$, $Fe^{3+}$, $Co^{2+}$, $Co^{3+}$, $Ru^{4+}$, $Rh^{3+}$, $Ni^{2+}$ |
| 3 | $Li^+$, $Al^{3+}$, $Ga^{3+}$, $Ti^{4+}$, $Si^{4+}$, $Ge^{4+}$, $Sn^{4+}$, $V^{5+}$, $P^{5+}$, $As^{5+}$, $Fe^{3+}$, $Fe^{4+}$, $Co^{2+}$, $Co^{3+}$ |

(1) dodecahedral sites
(2) octahedral sites
(3) tetrahedral sites

The garnets produced in accordance with the process of the present invention are those of which the constituent cations have hydroxides which can coexist in one and the same pH range, and which have solubilities of less than about $10^{-3}$ mol per liter. From the solubility curves of the various hydroxides, those skilled in the art can thus draw up compatibility lists for the cations and, by means of the Table of the occupation of the sites given above, deduce all the formulae of garnets which can be manufactured in accordance with the process of the present invention.

A non-limiting example of compatibility lists is as follows:

First list:
$Y^{3+}$, $La^{3+}$, $Ce^{3+}$, $Pr^{3+}$, $Nd^{3+}$, $Sm^{3+}$, $Eu^{3+}$, $Gd^{3+}$, $Tb^{3+}$, $Dy^{3+}$, $Ho^{3+}$, $Er^{3+}$, $Tm^{3+}$, $Yb^{3+}$, $Lu^{3+}$, $Sc^{3+}$, $Al^{3+}$, $Ga^{3+}$, $In^{3+}$, $Cr^{3+}$, $Fe^{3+}$, $Mn^{3+}$, $Zn^{2+}$, $Cd^{2+}$, $Co^{3+}$, $Cu^{2+}$, $Nb^{5+}$, $Ta^{5+}$.

Second list:
The same cations as the first list with the exception of $Ga^{3+}$ and $Al^{3+}$, but including also $Mg^{2+}$.

Third list:
The same cations as the first list with the exception of $Ga^{3+}$, $Al^{3+}$, and $Cr^{3+}$, but including also $Ca^{2+}$ and $Sr^{2+}$.

As is well known to those skilled in the art, the regions in which the solid solutions of the garnet structures exist are not always centered on the composition given by the general formula, but they are very slightly displaced relative to the latter; the process according to the invention also embraces these compositions.

The process of the present invention for the manufacture of a polycrystalline garnet comprises as a first step the preparation of a solution containing the salts of the constituent cations of the garnet, in the proportions corresponding to the composition of the latter. These salts can contain an inorganic or organic anion. Solutions of nitrates, chlorides, sulphates, formates or perchlorates can be used in particular. It is possible for this solution to have been prepared directly by mixing the solutions of salts, in the proportions calculated as a function of the composition of the desired garnet, or alternatively to have been prepared in accordance with the process comprising the following steps:

(a) calcining the oxides of the cations forming part of the composition of the garnet;

(b) weighing the amounts of oxides fixed by the formula of the garnet;

(c) dissolving the oxides in a strong acid; and (d) mixing the resulting solutions of salts.

According to step (a) of this process, the oxides forming part of the composition of the garnet are calcined. The calcination temperature and the calcination time are chosen so that they correspond, for the oxide, to the maximum loss in weight. The chosen calcination conditions must obviously permit the subsequent attack of the calcined oxide in a strong acid medium.

According to step (b) of this process, the amounts of oxides fixed by the formula of the garnet are weighed out. The precision of the weighing is modified in accordance with the precision of the formula of the garnet which it is desired to obtain. Thus, for certain formulae, it may be necessary to operate with a precision of 0.1 percent.

According to step (c) of this process, the oxides are dissolved in a strong acid. The dissolution is carried out separately or, if the conditions of dissolution of these oxides are similar, it is carried out simultaneously. The acid used can be concentrated or dilute. The acid can be chosen, in particular, from among the group comprising: hydrochloric acid, nitric acid, sulphuric acid, and perchloric acid. Hydrochloric acid or nitric acid is advantageously used.

The dissolution conditions vary according to the acids used. The speed of complete dissolution of the oxides depends, in particular, on the nature of the acid, its concentration, and the temperature. Good conditions are generally obtained if the dissolution is carried out with concentrated pure acids at the boiling point. A concentration above about 5 N proves advantageous. The size of the oxide particles is not a critical factor according to the process of the invention. However, if fairly rapid dissolution is desired, it is advantageous to use fairly fine particles, the diameter of which is preferably less than about 400 microns; more particularly, particles having a diameter of between about 1 and 50 microns result in easy processing.

The resulting solutions of salts are mixed according to step (d) if the oxides have been dissolved separately.

In the second step of the process according to the invention, the corresponding hydroxides are co-precipitated by means of a base in order to obtain a co-hydroxide.

The co-precipitation is carried out while stirring. A weak base, such as ammonia, urea, hexamethylenetetramine, ammonium carbamate, or the like, is preferably used as the base. The concentration of the base is preferably above about 5 N.

In the third step of the process of the invention, the co-hydroxide obtained is left to age for a period of between about 1 and 20 hours. If the precipitation of the co-hydroxide is complete, this aging step can optionally be omitted.

In the fourth step of the process of the invention, the filtration of the co-hydroxide obtained is carried out under pressure or in vacuo. The filtering element used must preferably have a very small pore size of the order of about 1 to 5 microns. As is well known to those skilled in the art, the co-hydroxide can be rendered filterable by adding to the precipitate, before or after aging, a flocculant or flocculating agent which is decomposable at low temperature.

In the fifth step of the process of the invention, the co-hydroxide is then washed. The washing is preferably carried out with water until the wash waters obtained have a pH in the region of neutrality. The purpose of this washing is essentially to remove the adsorbed salts. It can be carried out, in particular, either by passing a certain volume of water through co-hydroxide cake or by resuspending the filter cake.

In the sixth step of the process of the invention, the co-hydroxide is then dried in air or in vacuo at temperatures between about 100° C. and 200° C., for about 10 to 48 hours. This drying is preferably carried out in an oven at a temperature between about 110° and 150° C., for a period of between about 10 and 30 hours.

In the seventh step of the process of the invention, the dried product is calcined at a temperature above the temperature for the formation of the structure of the garnet in question.

For a given garnet, the calcination temperature and the calcination time depend, on the one hand, on the temperature for the formation of the garnet structure from the co-hydroxide, this temperature being determined without difficulty, by those skilled in the art, from the differential thermal analysis curves obtained on the dried product, and, on the other hand, on the conditions of the subsequent use of the calcined polycrystalline garnet. Under these conditions, a calcination temperature between about 800° and 1500° C. and a time of between 1 and 30 hours are generally suitable. The calcination is generally carried out under air or under an inert atmosphere.

The polycrystalline garnet obtained can be characterized by X-ray diffraction; it is possible to verify its garnet structure, check its homogeneity by verifying that no other structure is visible (in particular, no unreacted oxides are detected), and to measure its lattice parameter.

Exact knowledge of the composition of the polycrystalline garnet is one of the advantages of the process according to the invention during the subsequent drawing of the monocrystal.

Furthermore, scanning electron microscopy reveals the existence of elementary crystals having dimensions of the order of a few microns. These crystals can agglomerate to give a compact assembly.

The specific surface area of the polycrystalline garnet obtained in accordance with the process of the present invention is generally low, and its density is generally between about 6 and 7 grams per milliliter.

The present invention also relates to the monocrystal obtained from the polycrystalline garnet manufactured in accordance with the process described above. The monocrystal of garnet can be manufactured, in particular, using the known technique of Czochralski crystal drawing.

The advantages which have been mentioned above, and, in particular, the limitation on the inclusion of the metal from which the crucible is made and the longevity of the crucible compared with the prior art techniques, provides considerable industrial interest in the present invention.

The monocrystal, having the garnet structure, obtained from the polycrystalline garnet of the invention, can be used in all the fields in which these materials are of value, in particular, in electronics such as substrates for the manufacture of magnetic bubble memory devices.

The very numerous advantages of the invention, as regards both the polycrystalline garnet and the drawing of the monocrystal, are in accordance with the present disclosure.

SPECIFIC DESCRIPTION OF THE INVENTION

In order to disclose more clearly the nature of the present invention, the following examples illustrating the invention are given. It should be understood, however, that this is done solely by way of example and is intended neither to delineate the scope of the invention nor limit the ambit of the appended claims. In the examples which follow, and throughout the specification, the quantities of material are expressed in terms of parts by weight, unless otherwise specified.

EXAMPLE 1

This example illustrates the preparation of the polycrystalline gallium gadolinium garnet in accordance with the process of the invention. The stoichiometric composition of this garnet is $Gd_{3.00}Ga_{5.00}O_{12}$ and a solid solution of the garnet structure exists which is not centered on this composition, but is displaced towards the gadolinium-rich compositions. More particularly, the congruent-melt composition (approximately $Gd_{3.04}Ga_{4.96}O_{12}$) is different from the stoichiometric composition and it is preferable, under these conditions, if it is desired to draw the monocrystalline garnet by the Czochralski method, to start from a polycrystalline garnet of which the composition is between the congruent and stoichiometric compositions.

This example describes the preparation of the polycrystalline garnet having the composition $Gd_{3.01}Ga_{4.99}O_{12}$. The process of the example was carried out according to the following steps:

(1a) gadolinium oxide, $Gd_2O_3$, and gallium oxide, $Ga_2O_3$, were calcined for 15 hours at 1200° C.;

(1b) 5,673.8 grams of calcined $Gd_2O_3$ and 4,863.7 grams of calcined $Ga_2O_3$ were each weighed out;

(1c) the gadolinium oxide was dissolved in 17 liters of 6.4 N nitric acid in a 100-liter Pyrex reactor fitted with a stirrer coated with polytetrafluoroethylene (PTFE). Dissolution was rapid and exothermic and was carried out with a 1 square meter condenser under total reflux.

The gallium oxide was dissolved in 32 liters of 6.4 N nitric acid in a heated 100-liter Pyrex reactor fitted with a PTFE-coated stirrer. Complete dissolution at 100° C. under total reflux (1 m.$^2$ condenser) lasted over 8 hours;

(1d) the two resulting nitrate solutions were mixed and homogenized in a 120-liter polypropylene vat;

(2) the mixed gallium and gadolinium hydroxides were co-precipitated by pouring the solution of nitrates into a 6 N ammonia solution at a temperature of 20°–25° C. until a pH of 8.70 was obtained. The co-precipitation was performed in a 200-liter Pyrex reactor fitted with a PTFE-coated stirrer, the total duration of the co-precipitation being 5 hours.

(3) the resulting gallium and gadolinium co-hydroxides were left to age for 3 hours at ambient temperature while stirring;

(4) the co-hydroxides were filtered off in vacuo on a suction-type filter of diameter 140 cm. The filtering element was a polypropylene gauze. The thickness of the filter cake was 40 mm.;

(5) the cake was washed by passing 5 times 50 liters of water through the cake;

(6) the cake was dried in an oven in vacuo for 15 hours at 130° C., in stainless trays coated with PTFE. The loss in weight of the cake was about 75 percent; and (7) the product obtained was calcined for 5 hours at 1350° C., unde argon, in crucibles made of sintered alumina of high purity. The calcination temperature used was very much higher than the temperature for the formation of the garnet structure from the co-hydroxides, which was 820° C. (determined from the differential thermal analysis curve), but proves advantageous in giving a polycrystalline garnet which was directly fusible during Czochralski drawing, without any other treatment.

The loss in weight during the calcination was 18.2 percent, and the polycrystalline garnet was obtained with a yield of 96 percent, based on quantity of nitrate used.

Characterization of the resulting product by X-ray diffraction revealed that only the garnet structure was visible (no Ga$_2$O$_3$ structure and/or Gd$_2$O$_3$ structure).

Measurement of the lattice parameter gave a=12.378 Å, which corresponds well to the desired composition, namely, Gd$_{3.01}$Ga$_{4.99}$O$_{12}$.

The monocrystal obtained from this polycrystalline garnet by Czochralski drawing was absolutely perfect. The drawing was carried out with all the advantages given in the present disclosure.

EXAMPLE 2

Comparison Example

This example illustrates one of the advantages of the process according to the invention, compared with the process of the prior art which is commonly used for the preparation of polycrystalline garnets.

The polycrystalline garnet having the composition Gd$_{3.01}$Ga$_{4.99}$O$_{12}$ was prepared in accordance with the following steps:

1. Gadolinium oxide, Gd$_2$O$_3$ and gallium oxide, Ga$_2$O$_3$, were calcined for 15 hours at 1200° C.
2. 5,673.8 grams of calcined Gd$_2$O$_3$ and 4,863.7 grams of calcined Ga$_2$O$_3$ were weighed out.
3. These oxides were mixed and then calcined for 100 hours at 1350° C. This yielded a polycrystalline garnet in which 10 percent by weight of the Ga$_2$O$_3$ had not reacted. Analysis of this product by scanning electron microscopy revealed the existence of acicular crystals of unreacted Ga$_2$O$_3$; the photomicrograph (magnified 900 times) given in FIG. 1 of the drawings illustrates a product of this type.

Figure 2:
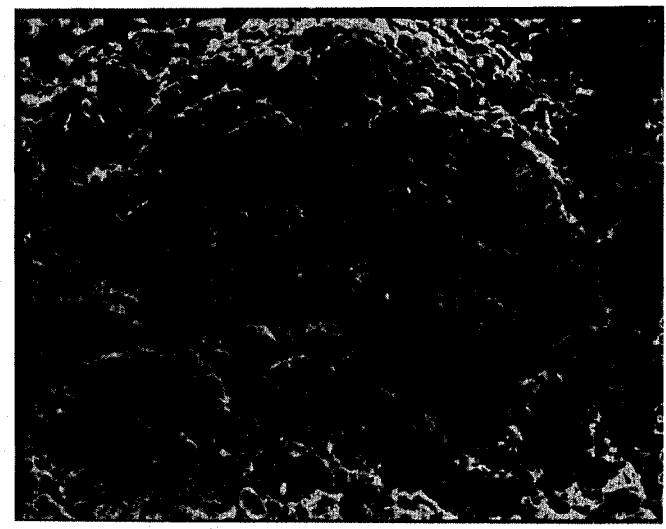
FIGS. 2, 3, and 4 are photomicrographs of the polycrystalline garnet of the present invention produced in accordance with Examples 1 and 2, below, magnified about 900 times.
Figure 3:
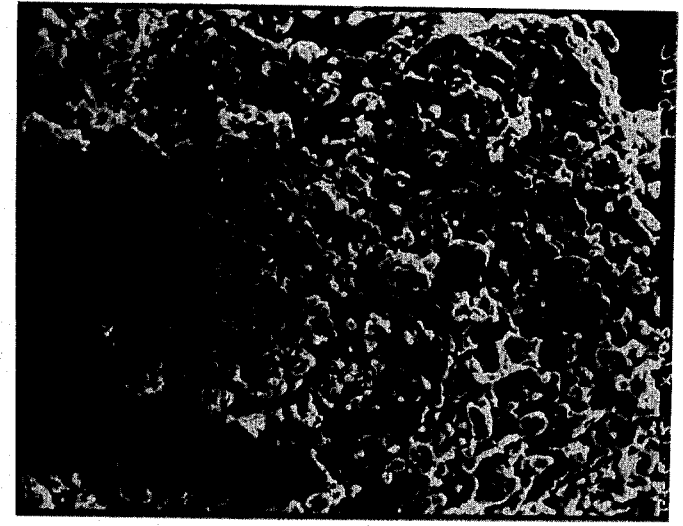
Figure 4:
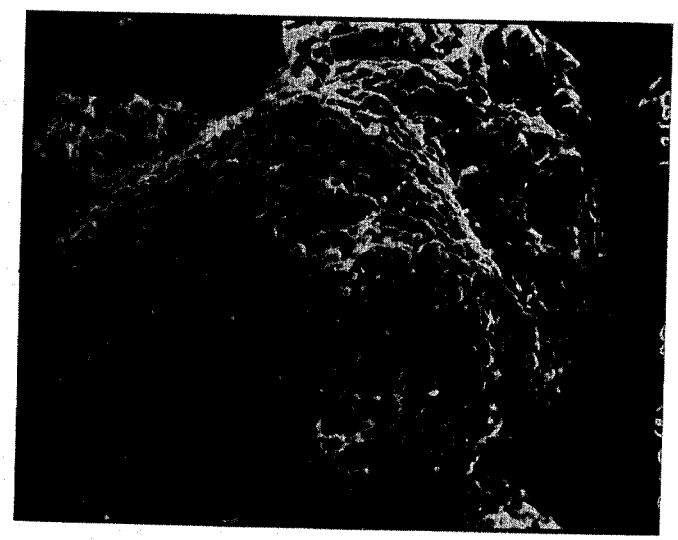

By comparison, the polycrystalline garnet obtained in accordance with the process of the invention, described in Example 1, above, is shown to possess a structure without inclusions. Photomicrographs (magnified 900 times) of these garnets which were obtained by scanning electron microscopy are given in FIGS. 2, 3, and 4 of the appended drawings.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed.

What is claimed is:

1. A process for manufacturing a pure polycrystalline garnet, which process consists essentially of the following steps:
   (1) a solution consisting essentially of the salts of the constituent cations of the garnet is prepared in accordance with the process comprising the following steps:
   (a) the oxides of the constituent cations of the garnet are calcined;
   (b) the amounts of oxides fixed by the formula of the garnet are weighed;
   (c) each oxide is dissolved in an acid; and
   (d) the resulting solutions of salts are mixed;
   (2) the corresponding hydroxides are co-precipitated by addition of a base to the solution in order to obtain a co-hydroxide;
   (3) the co-hydroxide is filtered off;
   (4) the co-hydroxide is washed;
   (5) the co-hydroxide is dried; and
   (6) the co-hydroxide is then subjected to a single calcination at a temperature of between about 800° C. and 1500° C. until completely reacted, whereby said pure polycrystalline garnet is produced, said garnet consisting essentially of the constituent cations from the solution and oxygen.

2. A process according to claim 1, wherein the co-hydroxide subsequent to step (2) is permitted to age before filtering it off in step (3).

3. A process according to claim 2, wherein the aging is carried out for about 1 to 20 hours.

4. A process according to claim 1, wherein, in step (1), the salts are chosen from among the group consisting of nitrates, chlorides, sulphates, formates, acetates, and perchlorates.

5. A process according to claim 1, wherein, in step 1(c), the acid is a strong acid.

6. A process according to claim 1, wherein the oxides are dissolved simultaneously in a strong acid.

7. A process according to claim 1 wherein the acid is chosen from among the group consisting of hydrochloric acid, nitric acid, sulphuric acid, and perchloric acid.

8. A process according to claim 7, wherein the dissolution is carried out with pure concentrated acid at the boiling point.

9. A process according to claim 1, wherein, in step (2), the base is a weak base which is chosen from among the group consisting of ammonia, urea, hexamethylenetetramine and ammonium carbamate.

10. A process according to claim 1, wherein, in step (2), the concentration of the base is above about 5 N.

11. A process according to claim 1, wherein, in step (3), the co-hydroxide is filtered off under pressure or in vacuo, the filtering element used preferably having a pore size of about 1 to 5 microns.

12. A process according to claim 1, wherein, in step (4), the co-hydroxide is washed with water until the wash waters obtained have a pH in the region of neutrality.

13. A process according to claim 1, wherein, in step (5), the co-hydroxide is dried in air or in vacuo at a temperature between about 100° C. and 200° C. for about 10 to 48 hours.

14. A process according to claim 1, wherein, in step (6), the co-hydroxide is calcined for about 1 to 30 hours.

15. A polycrystalline garnet obtained in accordance with the process of any one of the preceding claims, wherein it consists of crystals, the elementary dimensions of which are of the order of a few microns, and which are agglomerated to give a compact assembly.

16. A monocrystal obtained by a drawing process from the polycrystalline garnet manufactured in accordance with the process of claim 1 2, 3, 6, 7, 8, 9, 10, 11, 12, 13, 14 or 15.

17. A monocrystal according to claim 16 wherein the drawing process is a Czochralski drawing process.

* * * * *